(12) United States Patent
Araman

(10) Patent No.: US 9,052,098 B2
(45) Date of Patent: Jun. 9, 2015

(54) LIGHTING DEVICE COMPRISING AT LEAST ONE ELECTROLUMINESCENT DIODE

(76) Inventor: Antoine Araman, Beyrouth-Maten (LB)

( * ) Notice: Subject to any disclaimer, the term of this patent is extended or adjusted under 35 U.S.C. 154(b) by 741 days.

(21) Appl. No.: 13/049,285

(22) Filed: Mar. 16, 2011

(65) Prior Publication Data

US 2011/0286216 A1 Nov. 24, 2011

(30) Foreign Application Priority Data

Mar. 16, 2010 (LB) .......................................... 8948

(51) Int. Cl.
*F21V 29/00* (2006.01)
*H01L 21/48* (2006.01)
*H01L 23/367* (2006.01)
*F21Y 101/02* (2006.01)
*F21Y 103/00* (2006.01)

(52) U.S. Cl.
CPC ........... *F21V 29/004* (2013.01); *F21Y 2101/02* (2013.01); *H01L 21/4882* (2013.01); *H01L 23/3672* (2013.01); *F21V 29/225* (2013.01); *F21V 29/2293* (2013.01); *F21Y 2103/003* (2013.01); *F21V 29/20* (2013.01); *H01L 2924/0002* (2013.01)

(58) Field of Classification Search
CPC  F21Y 2101/02; F21S 48/1109; F21S 4/1154; F21S 48/1163; F21V 21/34; H01R 12/57; H01R 12/62; H05K 1/147; H05K 2201/10106; H05K 2201/2018; H05K 2203/049; H05K 2203/167
USPC ............ 362/800, 555, 218, 230, 231, 249.01, 362/264, 294, 311.02, 311.06, 345, 373, 362/249.02, 382, 396, 84, 97.2
See application file for complete search history.

(56) References Cited

U.S. PATENT DOCUMENTS

2005/0157500 A1* 7/2005 Chen et al. ..................... 362/294
2008/0055908 A1* 3/2008 Wu et al. ........................ 362/294

* cited by examiner

*Primary Examiner* — Stephen F Husar
*Assistant Examiner* — Danielle Allen
(74) *Attorney, Agent, or Firm* — Kenyon & Kenyon LLP

(57) ABSTRACT

According to the invention, the, or each, electroluminescent diode is mounted on a cooling radiator comprising a U-shaped main body and fins located in the space delimited by the main body and spaced by bracing systems.

14 Claims, 3 Drawing Sheets

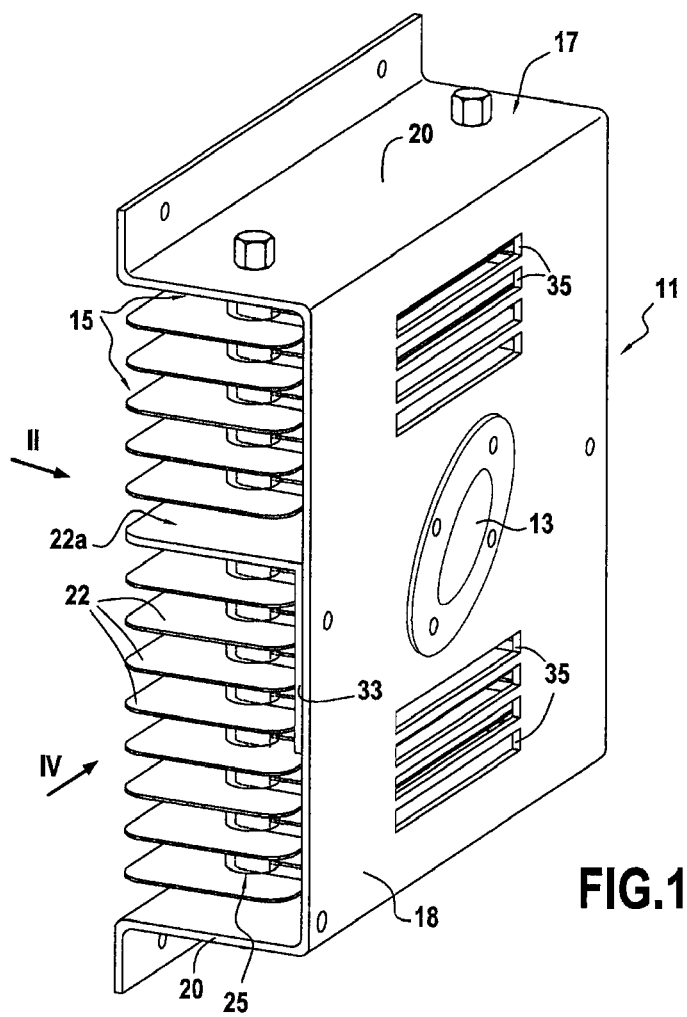
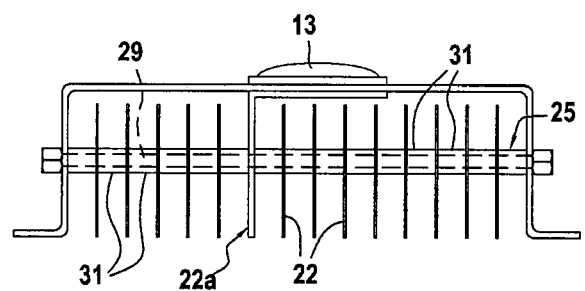
FIG.1
FIG.4

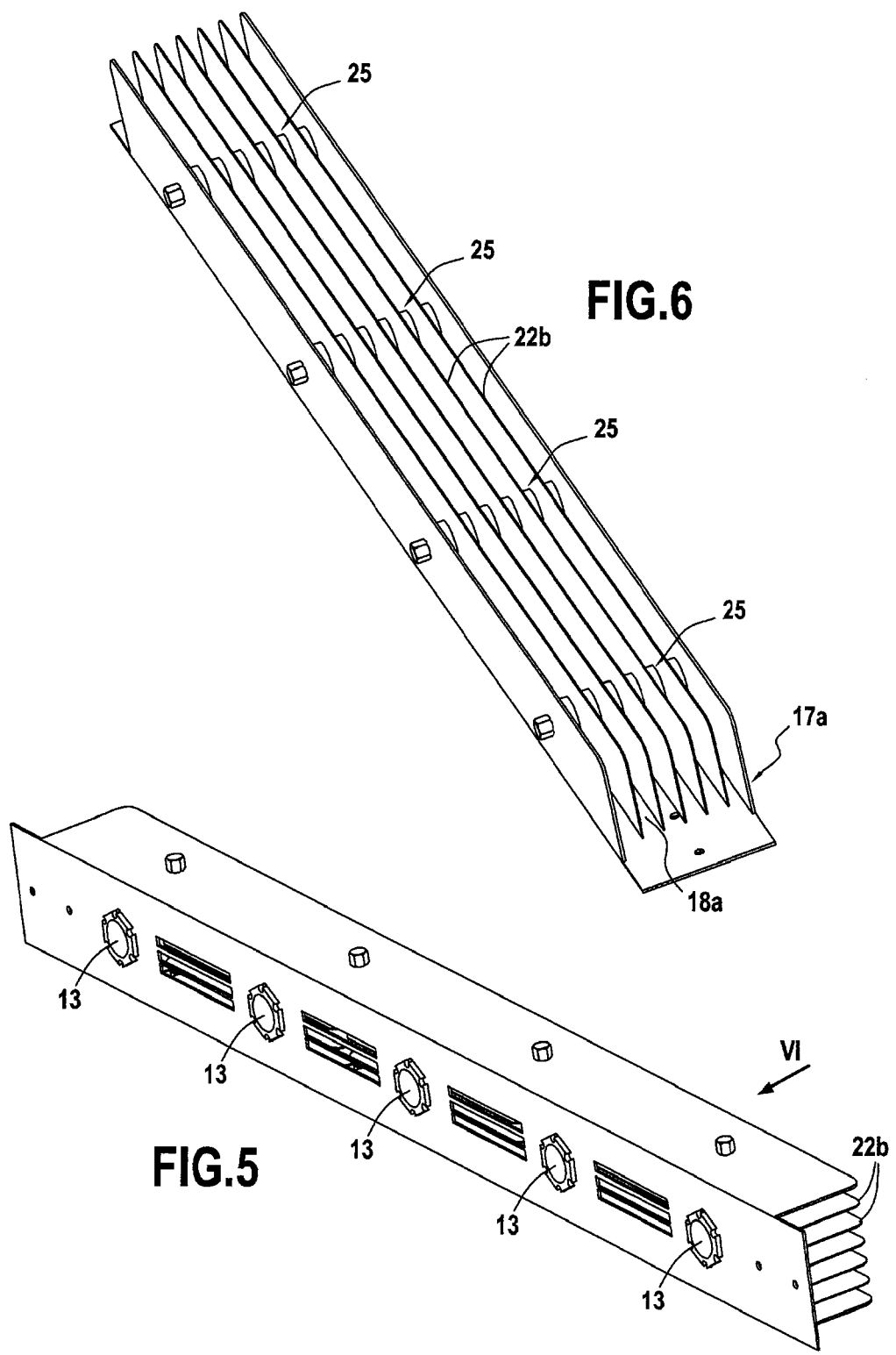

LIGHTING DEVICE COMPRISING AT LEAST ONE ELECTROLUMINESCENT DIODE

This application claims priority to Lebanese Patent Application No. 8948 filed 16 Mar. 2010, the content of which is incorporated herein by reference.

FIELD OF THE INVENTION

The invention relates to a lighting device comprising at least one electroluminescent diode, especially a lighting device using at least one such diode with high light-emitting efficiency. The invention relates more particularly to a particularly simple and inexpensive structure for cooling such a diode, effectively limiting its operating temperature and consequently boosting its efficacy and its service life.

BACKGROUND OF THE INVENTION

We are currently witnessing a major shift in the field of lighting, due to constantly improving performance in electroluminescent diodes better known by the abbreviation LED. For several years now, electroluminescent diodes have been proposed which individually have limited light-emitting efficiency such that several need to be grouped side by side to give out adequate lighting power, clearly inferior to that of superior filament lamps.

More recently, electroluminescent diodes with high light-emitting efficiency capable of rivalling filament lamps have appeared, with a view to progressively replacing them in the near future.

But an electroluminescent diode of this type preferably needs to be cooled to stabilise its operating temperature at a given value, for example of the order of 60 to 70° C.

In the field of semi-conductors, for example, it has been known for many years to cool power components by mounting them on radiators with strong thermal coupling to dissipate any heat released, by conduction then natural air convection. Radiators proposed for this purpose are either moulded in an aluminium alloy, or extruded in a comparable alloy, the extruded profile then being cut to the preferred length corresponding to the thermal power to be dissipated. Moulded or extruded radiators are very expensive components. In the case of moulding, moulds have to be provided for all required dimensions and it is not easy to reconcile production rates with the needs of the lighting market, such as it is occurring with the appearance of these novel LEDs. Extrusion is also a costly process and is complicated to implement. In both cases, cooling fins which are defined in such radiators all around the location of the component to be cooled are relatively thick, due to the moulding or extrusion techniques themselves, for any given thermal exchange surface. This results in a heavier radiator than would be possible to produce, due to cooling by equal convection, with a radiator having thinner fins. The mass of metal required, generally fairly costly aluminium ensures that this cooling radiator cannot be optimised and that its retail cost remains necessarily high.

SUMMARY OF THE INVENTION

The invention resolves all these problems by proposing a LED lighting device fitted with a cooling radiator of simple design, low in cost and easy to manufacture.

More particularly, the invention relates to a lighting device comprising at least one electroluminescent diode, characterised in that it comprises a cooling radiator of said diode, comprising a main U-shaped body comprising a base and two spaced parallel bands, defined in a thermally conductive material and fins made of thermally conductive material, arranged parallel to one another in the space delimited between the two bands and said base, and in that said fins are spaced from each other by at least two thermally conductive bracing systems, and that these systems are thermally coupled to the main body, said electroluminescent diode being fixed, with thermal contact, to said base.

The elements making up the radiator, which have just been specified above, are all elements of extremely simple structure. For example, the main body will advantageously be made from metal sheet folded at a right angle, according to two parallel lines, defining the abovementioned U-shaped profile. The fins will be arranged in the volume defined by the base and the parallel bands. Similarly, the fins can be plates cut out from metal sheet. Thus, all the elements used to produce thermal exchanges by natural convection with ambient air can be made from a metal hoop, for example made of aluminium or aluminium alloy. The tooling is traditional and readily available anywhere. Any change in dimensions (thickness, length, width) can easily be adapted as a function of the thermal power to be dissipated and also to consider the aesthetic characteristics of the lighting fixture to which the radiator is adapted, no transformation of production tools being required.

Other metals can be used, including less expensive metals than aluminium.

All the cooling fins can be of minimal thickness, of the order of a millimeter or less; which would be difficult or even impossible to achieve using moulding or extrusion techniques.

According to a possible embodiment, a bracing system as above comprises a rod, extending perpendicularly to said bands of the main body and fixed to the latter. The rods pass through holes in the above fins, whereas tubular spacers are engaged on said rod between the fins.

The thickness of the fins and the length of the spacers are calculated so that mounting of the rod causes fins and spacers to be tightened together, ensuring proper conduction of heat between the main body and the fins.

Advantageously, said rod is a screw or a threaded rod bolted between said parallel bands and tightening the spacers and the fins together.

The tubular spacers are preferably made of copper, brass or a similar alloy. They can also be made of aluminium or aluminium alloy.

To facilitate insertion of fins between the spacers, prior to tightening of the screw or threaded rod, it is advantageous for the holes of each fin to extend as far as an edge of the latter. Each hole has the form of an open slot.

According to another advantageous characteristic, the base comprises holes, preferably slots, for thermal exchanges with the fins by air convection.

BRIEF DESCRIPTION OF THE DRAWINGS

The invention will be better comprehended and other advantages of the latter will emerge more clearly from the following description of several embodiments of a lighting device in keeping with its principle, given solely by way of example and in reference to the attached diagrams, in which:

FIG. 1 is a general perspective view of a first embodiment of a lighting device according to the invention;

FIG. 4 is a view according to arrow IV of FIG. 1;

FIG. 5 is a general perspective view of another embodiment, bearing several evenly spaced electroluminescent diodes; and FIG. 6 is a perspective view according to arrow VI of FIG. 5.

DETAILED DESCRIPTION

Figure 2:
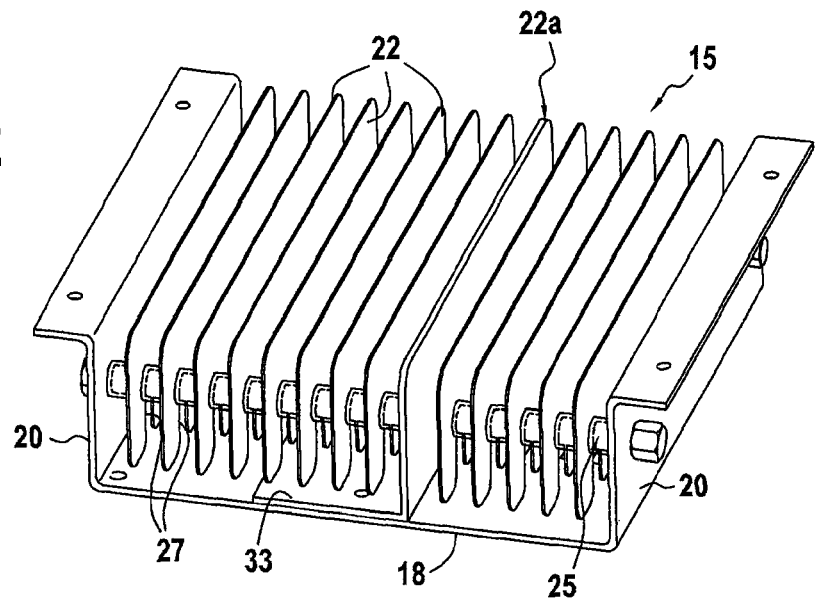
FIG. 2 is a view according to arrow II of FIG. 1.
Figure 3:
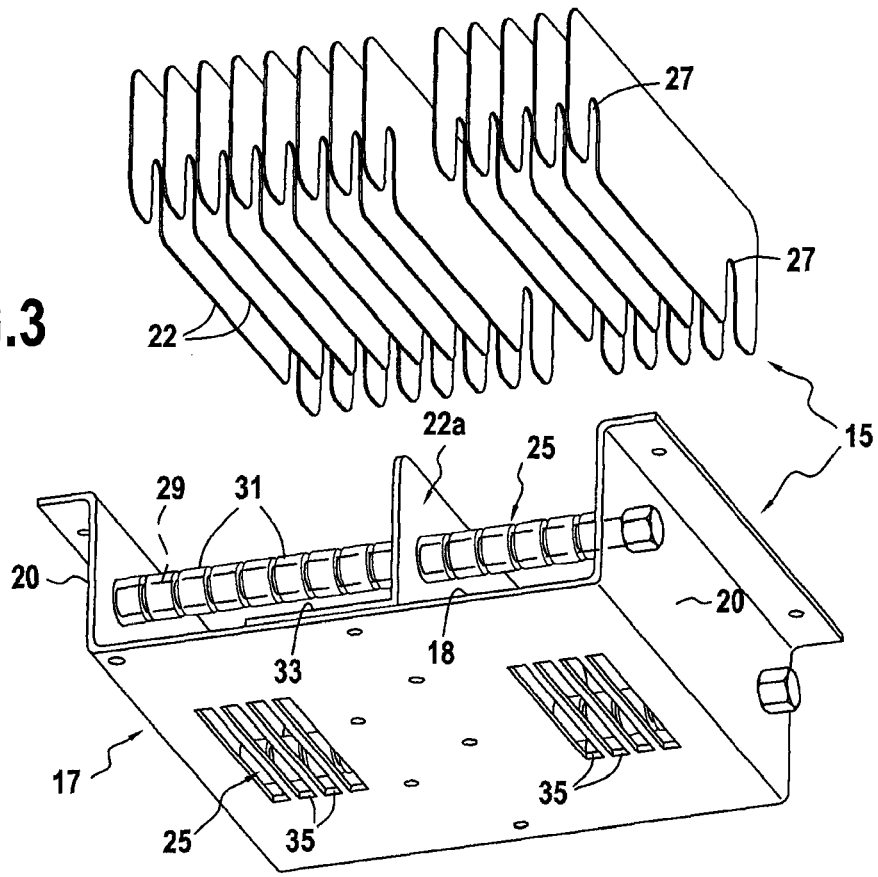
FIG. 3 is a perspective view of the elements of the radiator, illustrating the mounting.

In reference to the diagrams and more particularly to FIGS. 1 to 4 relative to the first embodiment, these show a lighting device 11 comprising an electroluminescent diode 13, advantageously a LED diode of high light-emitting efficiency. This diode is joined to a cooling radiator 15, according to the example essentially comprising components cut out from metal sheet, especially aluminium or aluminium alloy sheeting, some then being folded and/or pierced. The operations carried out on these elements used to comprise thermal surface exchange are all simple operations such as cutting out, folding and crimping, carried out on thin sheeting. As illustrated, the cooling radiator comprises a main U-shaped body 17 comprising a base 18 and two spaced parallel bands 20. Flat fins 22 are arranged parallel to one another in the space delimited between the two bands 20 and said base 18 of the main body 17.

According to a non-limiting example, the main body is made from an aluminium or aluminium alloy sheet of 1.25 mm in thickness, whereas the fins are cut out from an aluminium or aluminium alloy sheet of $5/10^{th}$ of a millimeter in thickness. These fins 22 are spaced apart by at least two thermally conductive bracing systems 25, each being connected by its ends to said parallel bands 20 of the main body 17. The electroluminescent diode 13 is fixed, with thermal contact, to the base 18 of the main body. In the example shown, the base is substantially square and bears at least one high-output electroluminescent diode 13, fixed substantially in its centre, in thermal coupling conditions allowing proper heat flow between the diode and the base. As is illustrated, the fins are pierced by holes 27 located at locations selected for their assembly to the bracing systems 25.

Such a bracing system 25 comprises a rod 29, in this case a screw or a threaded rod, extending perpendicularly to the bands and fixed to the latter. The rods pass through the above holes 27 of the fins and of the tubular spacers 31, and are engaged on the rod 29 between the fins 22.

Since the rod 29 is advantageously a screw or a threaded rod, it can be bolted between said parallel bands of the main body by tightening together the spacers 31 and the fins 22. These spacers are made of good heat-conducting material, for example copper, brass or similar alloy.

The holes 27 can have a closed contour (round) but according to an advantageous characteristic the holes 27 of each fin (assembling them to the bracing systems) extend as far as an edge of the latter, as illustrated. Each hole 27 forms an open slot. This makes mounting much easier, as all it takes is for the screw or threaded rod to be engaged between the two parallel bands after the preferred number of spacers has been "threaded" through, then the fins are inserted between the spacers and finally the screw or the threaded rod is bolted to tighten the fins and the spacers together. After they are tightened, the bracing systems provide proper thermal coupling, by conduction, between the main body 17 and the fins 22.

According to a possible embodiment, direct fixing between at least one fin 22a and the base 18 of the main body 17 can however be provided. This fin has an L-shaped profile in order to define an elongated flange 33 extending longitudinally and this elongated flange is fixed to the base of the main U-shaped body, by bolting, riveting or any other means. This establishes a direct link via heat conduction between the base of the main body and this particular fin 22a. In the example shown, this special fin with L-shaped profile is preferably located substantially in the centre of the space defined by the main body so that it is fixed to the base of the latter, closest to the placement of the LED.

As is illustrated, the base 18 advantageously comprises holes 35, preferably slots for better thermal exchange with the fins, by air convection. The LED is fixed to the base 18 on the outer face of the latter, opposite to the space where the fins are arranged. In this way, if the device is placed high up, for example integrated into a false ceiling, the fins are not visible.

Of course, several LEDs can be installed on the embodiment of square base described in reference to FIGS. 1 to 4 by changing the placement of the holes or slots 35.

The embodiment of FIGS. 5 and 6 is distinguished from the preceding one by the fact that the base 18a of the main body 17a has the form of an elongated rectangle and in that it bears several electroluminescent diodes 13 evenly spaced in the longitudinal direction of the latter. As a consequence, the main body 17a also has an elongated form, as do the fins 22b. These are held by a larger number of bracing systems 25, evenly spaced. This variant, for example, replaces a fluorescent tube. It can be integrated into a system forming a reflector (not shown) used to replace a false ceiling tile, for example.

In the described examples, thermal coupling between the fins and the main body is completed notably by means of the bracing systems, that is, heat mainly escapes via conduction from the main body to the fins by passing through the bracing systems.

However, as shown, direct fixing between at least one fin and the base of the main body, can be provided.

Thus, thermal coupling may be completed either by the fact that each bracing system is connected by its ends to the parallel bands of the main body, or by the fact that at least one fin has an L-shaped profile defining an elongated flange fixed to the base of the main body, preferably by the combination of these two coupling modes.

The invention claimed is:

1. A lighting device comprising at least one electroluminescent diode and a cooling radiator of said diode comprising a main U-shaped body with a base and two spaced parallel bands projecting in a projection direction from said base and defined in a thermally conductive material and fins defined in a thermally conductive material, arranged parallel to one another in the space delimited between the two bands and said base and wherein said fins are spaced apart by at least two thermally conductive bracing systems, each connected at its ends to said parallel bands and thermally coupled to the main body and said electroluminescent diode being fixed with thermal contact to said base such that said electroluminescent diode emits light in an emission direction opposite to said projection direction.

2. The device as claimed in claim 1, wherein said main body is made from a metal sheet folded at a right angle according to two parallel lines.

3. The device as claimed in claim 1, wherein said fins are plates cut out from a metal sheet.

4. The device as claimed in claim 1, wherein said fins are pierced with holes located at selected placements and wherein an abovementioned bracing system comprises a rod extending perpendicularly to said bands and fixed thereto, wherein said rod passes through holes of the fins and wherein tubular spacers are engaged on said rod between said fins.

5. The device as claimed in claim 4, wherein said rod is a screw or threaded rod, bolted between said parallel bands and tightening the spacers and the fins together.

6. The device as claimed in claim 1, wherein said main body is made of aluminium or aluminium-based alloy.

7. The device as claimed in claim 1, wherein said fins are made of aluminium or aluminium-based alloy.

8. The device as claimed in claim 4, wherein said tubular spacers are made of copper, brass or the like.

9. The device as claimed in claim 4, wherein the holes of each abovementioned fin extend as far as an edge of the latter, forming an open slot, to make it easier to insert fins between the spacers prior to tightening of said screw or threaded rod.

10. The device as claimed in claim 1, wherein at least one fin has an L-shaped profile so as to define an elongated flange extending longitudinally and this elongated flange is fixed to the base of said main U-shaped body.

11. The device as claimed in claim 1, wherein said base comprises holes, preferably slots for better thermal exchange with the fins, via air convection.

12. The device as claimed in claim 1, wherein said base is substantially square and bears at least one electroluminescent diode mounted substantially in its center.

13. The device as claimed in claim 1, wherein said base has the shape of an elongated rectangle and bears several electroluminescent diodes evenly spaced in the longitudinal direction thereof.

14. A lighting device comprising at least one electroluminescent diode and a cooling radiator of said diode comprising a main U-shaped body with a base and two spaced parallel bands projecting in a projection direction from said base and defined in a thermally conductive material and fins defined in a thermally conductive material, arranged parallel to one another in the space delimited between the two bands and said base and wherein said fins are spaced apart, from each other, and from the base and the two bands, by at least two thermally conductive bracing systems, each connected at its ends to said parallel bands and thermally coupled to the main body and said electroluminescent diode being fixed with thermal contact to said base such that said electroluminescent diode emits light in an emission direction opposite to said projection direction.

* * * * *